(12) United States Patent
Lee et al.

(10) Patent No.: US 9,593,408 B2
(45) Date of Patent: Mar. 14, 2017

(54) THIN FILM DEPOSITION APPARATUS INCLUDING DEPOSITION BLADE

(75) Inventors: Jung-Min Lee, Yongin (KR); Choong-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1201 days.

(21) Appl. No.: 12/815,673

(22) Filed: Jun. 15, 2010

(65) Prior Publication Data
US 2011/0033619 A1  Feb. 10, 2011

(30) Foreign Application Priority Data
Aug. 10, 2009 (KR) .................... 10-2009-0073523

(51) Int. Cl.
| | | |
|---|---|---|
| C23C 14/00 | (2006.01) | |
| C23C 14/24 | (2006.01) | |
| C23C 14/04 | (2006.01) | |
| C23C 14/12 | (2006.01) | |

(52) U.S. Cl.
CPC .......... *C23C 14/243* (2013.01); *C23C 14/042* (2013.01); *C23C 14/12* (2013.01)

(58) Field of Classification Search
USPC ...................................................... 427/248.1
See application file for complete search history.

(56) References Cited

U.S. PATENT DOCUMENTS

| | | |
|---|---|---|
| 4,687,939 A | 8/1987 | Miyauchi et al. |
| 6,091,195 A | 7/2000 | Forrest et al. |
| 6,274,198 B1 | 8/2001 | Dautartas |

(Continued)

FOREIGN PATENT DOCUMENTS

| | | |
|---|---|---|
| EP | 1 413 644 | 4/2004 |
| EP | 1 418 250 A2 | 5/2004 |

(Continued)

OTHER PUBLICATIONS

KIPO Registration Determination Certificate dated Oct. 31, 2011, for Korean priority Patent application 10-2010-0014273, corresponding to cross reference U.S. Appl. No. 12/849,092, 5 pages.

(Continued)

*Primary Examiner* — David Turocy
(74) *Attorney, Agent, or Firm* — Lewis Roca Rothgerber Christie LLP

(57) ABSTRACT

A thin film deposition apparatus includes a deposition source that is disposed opposite to a substrate and holds a deposition material that is vaporized; a first nozzle unit disposed between the substrate and the deposition source and having first slit units arranged in a first direction of the substrate; a second nozzle unit disposed between the first nozzle unit and the substrate and having second slit units arranged in the first direction of the substrate; and at least one barrier member assembly disposed between the first nozzle unit and the second nozzle unit and partitioning the space between the first nozzle unit and the second nozzle unit. A deposition blade is optionally disposed in any space formed between the first nozzle unit and the second nozzle unit during a stand-by mode to prevent the deposition of the deposition material from being deposited onto undesirable regions of the chamber.

4 Claims, 6 Drawing Sheets

(56) References Cited

U.S. PATENT DOCUMENTS

| | | |
|---|---|---|
| 6,280,821 B1 | 8/2001 | Kadunce et al. |
| 6,371,451 B1 | 4/2002 | Choi |
| 6,579,422 B1 | 6/2003 | Kakinuma |
| 6,749,906 B2 | 6/2004 | Van Slyke |
| 6,878,209 B2 | 4/2005 | Himeshima et al. |
| 7,006,202 B2 | 2/2006 | Byun et al. |
| 8,193,011 B2 | 6/2012 | Kang et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101932 A1 | 6/2003 | Kang |
| 2003/0101937 A1 | 6/2003 | Van Slyke et al. |
| 2003/0118950 A1 | 6/2003 | Chao et al. |
| 2003/0168013 A1 | 9/2003 | Freeman et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0029028 A1 | 2/2004 | Shimizu |
| 2004/0056244 A1 | 3/2004 | Marcus et al. |
| 2004/0086639 A1* | 5/2004 | Grantham et al. ......... 427/248.1 |
| 2004/0115338 A1* | 6/2004 | Yoneda ............................ 427/66 |
| 2004/0115342 A1 | 6/2004 | Shigemura |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1* | 11/2004 | Sakata et al. ................. 118/719 |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0072361 A1 | 4/2005 | Yang et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0229848 A1 | 10/2005 | Shinriki et al. |
| 2006/0011136 A1 | 1/2006 | Yamazaki et al. |
| 2006/0022590 A1 | 2/2006 | Aziz et al. |
| 2006/0090705 A1* | 5/2006 | Kim ............................ 118/726 |
| 2006/0110544 A1 | 5/2006 | Kim et al. |
| 2006/0113907 A1 | 6/2006 | Im et al. |
| 2006/0144325 A1 | 7/2006 | Jung et al. |
| 2006/0174829 A1 | 8/2006 | An et al. |
| 2006/0205101 A1 | 9/2006 | Lee et al. |
| 2007/0054044 A1 | 3/2007 | Shimosaki et al. |
| 2007/0077358 A1 | 4/2007 | Jeong et al. |
| 2007/0148337 A1 | 6/2007 | Nichols et al. |
| 2007/0157879 A1 | 7/2007 | Yotsuya |
| 2007/0163497 A1 | 7/2007 | Grace et al. |
| 2007/0178708 A1 | 8/2007 | Ukigaya |
| 2008/0018236 A1 | 1/2008 | Arai et al. |
| 2008/0115729 A1 | 5/2008 | Oda et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2009/0017192 A1 | 1/2009 | Matsuura |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0277386 A1 | 11/2009 | Takagi et al. |
| 2010/0001301 A1 | 1/2010 | Karg et al. |
| 2010/0055810 A1 | 3/2010 | Sung et al. |
| 2010/0192856 A1 | 8/2010 | Sung et al. |
| 2010/0271602 A1 | 10/2010 | Hanazaki |
| 2010/0297349 A1 | 11/2010 | Lee et al. |
| 2011/0220019 A1 | 9/2011 | Lee et al. |
| 2012/0009328 A1 | 1/2012 | Ryu et al. |

FOREIGN PATENT DOCUMENTS

| | | |
|---|---|---|
| EP | 1 518 940 | 3/2005 |
| JP | 57-194252 | 11/1982 |
| JP | 4-272170 | 9/1992 |
| JP | 05-230628 | 9/1993 |
| JP | 08-027568 | 1/1996 |
| JP | 09-095776 | 4/1997 |
| JP | 2000-68054 | 3/2000 |
| JP | 2001-52862 | 2/2001 |
| JP | 2001-93667 | 4/2001 |
| JP | 2002-075638 | 3/2002 |
| JP | 2002-175878 | 6/2002 |
| JP | 2003-3250 | 1/2003 |
| JP | 2003-77662 | 3/2003 |
| JP | 2003-157973 | 5/2003 |
| JP | 2003-297562 | 10/2003 |
| JP | 2003-321767 | 11/2003 |
| JP | 2004-43898 | 2/2004 |
| JP | 2004-103269 | 4/2004 |
| JP | 2004-103341 | 4/2004 |
| JP | 2004-169169 | 6/2004 |
| JP | 2004-199919 | 7/2004 |
| JP | 2004-349101 | 12/2004 |
| JP | 2005-44592 | 2/2005 |
| JP | 2005-122980 | 5/2005 |
| JP | 2005-165015 | 6/2005 |
| JP | 2005-174843 | 6/2005 |
| JP | 2005-206939 | 8/2005 |
| JP | 2005-235568 | 9/2005 |
| JP | 2005-293968 | 10/2005 |
| JP | 2005-296737 | 10/2005 |
| JP | 2006-028583 | 2/2006 |
| JP | 2006-172930 | 6/2006 |
| JP | 2006-176809 | 7/2006 |
| JP | 2006-210038 | 8/2006 |
| JP | 2006-275433 | 10/2006 |
| JP | 2006-292955 | 10/2006 |
| JP | 2007-47293 | 2/2007 |
| JP | 2007-186740 | 7/2007 |
| JP | 2008-108628 | 5/2008 |
| JP | 2008-121098 | 5/2008 |
| JP | 2008-521165 | 6/2008 |
| JP | 2009-19243 | 1/2009 |
| JP | 2009-024208 | 2/2009 |
| JP | 2009-081165 | 4/2009 |
| JP | 2009-87910 | 4/2009 |
| JP | 2010-261081 | 11/2010 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 10-2001-0059939 | 7/2001 |
| KR | 10-2001-0092914 | 10/2001 |
| KR | 10-2001-0093666 | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 10-2002-0090934 | 12/2002 |
| KR | 10-2003-0001745 | 1/2003 |
| KR | 10-2003-0034730 | 5/2003 |
| KR | 10-2003-0046090 | 6/2003 |
| KR | 2003-0069684 | 8/2003 |
| KR | 10-2003-0091947 | 12/2003 |
| KR | 2003-0094033 | 12/2003 |
| KR | 10-2004-0014258 | 2/2004 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-2004-0087142 | 10/2004 |
| KR | 10-2005-0062853 | 6/2005 |
| KR | 10-2006-0008602 | 1/2006 |
| KR | 10-2006-0018745 | 3/2006 |

(56) References Cited

FOREIGN PATENT DOCUMENTS

| | | |
|---|---|---|
| KR | 2006-0020050 | 3/2006 |
| KR | 10-2006-0056706 | 5/2006 |
| KR | 10-2006-0058459 | 5/2006 |
| KR | 2006-0049050 | 5/2006 |
| KR | 10-2006-0065978 | 6/2006 |
| KR | 10-2006-0073367 | 6/2006 |
| KR | 2006-0059068 | 6/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 | 10/2006 |
| KR | 10-2006-0104675 | 10/2006 |
| KR | 10-2006-0109627 | 10/2006 |
| KR | 10-0635903 B1 | 10/2006 |
| KR | 10-2006-0114462 | 11/2006 |
| KR | 10-0645719 B1 | 11/2006 |
| KR | 10-2006-0123944 | 12/2006 |
| KR | 10-0687007 | 2/2007 |
| KR | 10-2007-0025164 | 3/2007 |
| KR | 10-0696547 | 3/2007 |
| KR | 10-0696550 | 3/2007 |
| KR | 10-0697663 B1 | 3/2007 |
| KR | 10-2007-0035796 | 4/2007 |
| KR | 10-2007-0050793 | 5/2007 |
| KR | 10-0723627 | 5/2007 |
| KR | 10-0739309 B1 | 7/2007 |
| KR | 10-2007-0080635 | 8/2007 |
| KR | 10-2007-0105595 | 10/2007 |
| KR | 10-0770653 | 10/2007 |
| KR | 10-2007-0112668 | 11/2007 |
| KR | 10-0787457 B1 | 12/2007 |
| KR | 10-2008-0001184 | 1/2008 |
| KR | 10-2008-0003720 | 1/2008 |
| KR | 10-0800125 | 1/2008 |
| KR | 10-2008-0036983 | 4/2008 |
| KR | 10-0823508 | 4/2008 |
| KR | 10-2008-0044775 | 5/2008 |
| KR | 10-2008-0048653 | 6/2008 |
| KR | 10-2008-0055124 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 | 7/2008 |
| KR | 10-2008-0062212 | 7/2008 |
| KR | 10-2008-0109559 | 12/2008 |
| KR | 10-2009-0038733 | 4/2009 |
| KR | 10-2009-0040618 | 4/2009 |
| KR | 10-2009-0052155 | 5/2009 |
| KR | 10-2009-0053417 | 5/2009 |
| KR | 10-2009-0066996 | 6/2009 |
| KR | 10-0908232 B1 | 7/2009 |
| KR | 10-2009-0093161 | 9/2009 |
| KR | 10-2010-0000128 | 1/2010 |
| KR | 10-2010-0000129 | 1/2010 |
| KR | 10-2010-0026655 | 3/2010 |
| KR | 10-2010-0090070 | 8/2010 |
| KR | 10-2010-0099806 | 9/2010 |
| KR | 10-2010-0126125 | 12/2010 |
| KR | 10-2011-0101767 | 9/2011 |
| KR | 10-2012-0006324 | 1/2012 |
| WO | WO 99/025894 | 5/1999 |
| WO | WO 2008/004792 | 1/2008 |

OTHER PUBLICATIONS

KIPO Office action dated Aug. 1, 2011, for Korean priority Patent application 10-2009-0073523, 3 pages.
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Gook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hoe-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
U.S. Appl. No. 13/031,756, filed Feb. 22, 2011, Yong Sup Choi et al., Samsung Mobile Display Co., Ltd.
KIPO Office action dated Feb. 6, 2012, for Korean Patent application 10-2010-0014274, 9 pages.
Patent Abstracts of Japan, and English machine translation of Japanese Publication 2009-024208, (30 pages).
KIPO Office action dated Aug. 1, 2011 for Korean Patent application 10-2009-0074001, (3 pages).
KIPO Office action dated Feb. 1, 2012 for Korean Patent application 10-2010-0014272, (4 pages).
KIPO Office action dated Feb. 6, 2012 for Korean Patent application 10-2010-0021835, (4 pages).

(56) References Cited

OTHER PUBLICATIONS

KIPO Office action dated Apr. 2, 2012 for Korean Patent application 10-2010-0066993, (4 pages).
KIPO Notice of Allowance dated Aug. 24, 2012 for Korean Patent application 10-2010-0066993, (5 pages).
KIPO Notice of Allowance dated Sep. 28, 2011 for Korean Patent application 10-2009-0052357, (5 pages).
KIPO Notice of Allowance dated Nov. 25, 2011 for Korean Patent application 10-2010-0014277, (5 pages).
KIPO Office action dated Feb. 1, 2012 for Korean Patent application 10-2010-0011196, (4 pages).
KIPO Office action dated Feb. 1, 2012 for Korean Patent application 10-2010-0013848, (4 pages).
KIPO Office action dated Jan. 13, 2012 for Korean Patent application 10-2009-0056529, (5 pages).
KIPO Notice of Allowance dated Jul. 20, 2012 for Korean Patent application 10-2010-0003545, (5 pages).
KIPO Notice of Allowance dated Apr. 30, 2012 for Korean Patent application 10-2010-0066992, (5 pages).
Japanese Office action dated Aug. 21, 2012 for Japanese Patent application 2010-145075, (5 pages).
KIPO Office action dated Sep. 1, 2012 for Korean Patent application 10-2010-0010136, (5 pages).
KIPO Notice of Allowance dated Sep. 1, 2012 for Korean Patent application 10-2010-0013848, (5 pages).
KIPO Notice of Allowance dated Sep. 1, 2012 for Korean Patent application 10-2010-0009160, (5 pages).
Japanese Office action dated Sep. 4, 2012 for Japanese Patent application 2010-152846, (4 pages).
English machine translation of Japanese Publication 2004-349101, dated Dec. 9, 2004, (10 pages).
KIPO Office action dated Aug. 28, 2012 for Korean Patent application 10-2010-0014274, (5 pages).
KIPO Notice of Allowance dated Sep. 1, 2012 for Korean Patent application 10-2010-0014276, (5 pages).
U.S. Office action dated Dec. 20, 2012, for cross reference U.S. Appl. No. 12/984,289, (20 pages).
U.S. Office action dated Dec. 17, 2012, for cross reference U.S. Appl. No. 12/873,556, (37 pages).
U.S. Office action dated Jan. 25, 2013, for cross reference U.S. Appl. No. 13/015,357, (21 pages).
U.S. Office action dated Feb. 26, 2013, for cross reference U.S. Appl. No. 12/794,093, (31 pages).
U.S. Office action dated Apr. 1, 2013, for cross reference U.S. Appl. No. 12/784,774, (44 pages).
U.S. Notice of Allowance dated Mar. 18, 2013, for cross reference U.S. Appl. No. 12/795,001, (29 pages).
U.S. Office action dated Mar. 18, 2013, for cross reference U.S. Appl. No. 12/984,231, (29 pages).
U.S. Office action dated Mar. 22, 2013, for cross reference U.S. Appl. No. 12/987,569, (12 pages).
U.S. Office action dated Mar. 15, 2013, for cross reference U.S. Appl. No. 12/813,786, (33 pages).
U.S. Office action dated Mar. 19, 2013, for cross reference U.S. Appl. No. 13/194,759, (36 pages).
U.S. Office action dated May 7, 2013, for cross reference U.S. Appl. No. 12/820,270, (37 pages).

* cited by examiner

THIN FILM DEPOSITION APPARATUS INCLUDING DEPOSITION BLADE

CROSS-REFERENCE TO RELATED APPLICATION

This application claims the benefit of Korean Patent Application No. 10-2009-0073523, filed Aug. 10, 2009 in the Korean Intellectual Property Office, the disclosure of which is incorporated herein by reference.

BACKGROUND

1. Field

Aspects of the present invention relate to a thin film deposition apparatus, and more particularly, to a thin film deposition apparatus including a deposition blade so that a deposition material is not deposited on a nozzle unit during a deposition process.

2. Description of the Related Art

Organic light-emitting display devices include an anode, a cathode, and an emission layer. Organic light-emitting display devices may optionally include intermediate layers to achieve high light-emission efficiency. Examples of such intermediate layers include an electron injection layer, a hole transport layer, and a hole injection layer.

The anode, the cathode, the emission layer, and the intermediate layer may be formed via various methods, one of which is a deposition method. When an organic light-emitting display device is manufactured using the deposition method, a fine metal mask (FMM) is used. The FMM has a pattern that corresponds to a thin film to be formed on a substrate. The FMM is disposed to closely contact the substrate. A thin film material is deposited over the FMM in order to form the thin film having a desired pattern. In this regard, the size of the FMM has to be the same as that of the substrate. Thus, the size of the FMM has to be increased as the substrate becomes larger. However, it is neither straightforward to manufacture a large FMM nor to extend an FMM to be accurately aligned with a pattern.

Furthermore, a deposition method using a FMM has low deposition efficiency. Deposition efficiency refers to the ratio of a deposition material deposited on a substrate to the deposition material vaporized from a deposition source. The deposition method using a FMM has a deposition efficiency of about 32%. Also, in the deposition method using a FMM, about 68% of the deposition material that is not deposited on the substrate remains adhered to a thin film deposition apparatus. Thus, it is not straightforward to reuse the deposition material not deposited on the substrate.

SUMMARY

Aspects of the present invention provide a thin film deposition apparatus including a deposition blade, by which a deposition material is easily deposited on a substrate with high deposition efficiency.

Aspects of the present invention provide a thin film deposition apparatus including a deposition blade by which a deposition material continuously discharged from a deposition source is not deposited on a nozzle unit during a deposition process.

According to an aspect of the present invention, there is provided a thin film deposition apparatus for depositing a deposition material on a substrate, the thin film deposition apparatus including: a deposition source that is disposed opposite to a substrate and includes a deposition material that is vaporized; a first nozzle unit disposed in front of the deposition source and including a plurality of first slit units arranged in a first direction of the substrate; a second nozzle unit disposed between the first nozzle unit and the substrate and including a plurality of second slit units arranged in the first direction of the substrate; a first barrier wall assembly disposed between the first nozzle unit and the second nozzle unit and including a plurality of first barrier walls arranged to partition the space between the first nozzle unit and the second nozzle unit; and a second barrier wall assembly disposed between the first barrier wall assembly and the second nozzle unit and including a plurality of second barrier walls, wherein the first barrier wall assembly and the second barrier wall assembly are separated from each other by a first distance, and a first deposition blade is optionally disposed in the space between the first barrier wall assembly and the second barrier wall assembly during a stand-by mode of the thin film deposition apparatus.

According to an aspect of the invention, the thickness of the first deposition blade may be less than the first distance between the first barrier wall assembly and the second barrier wall assembly.

According to an aspect of the invention, the length of the first deposition blade may be the same as or greater than the length of the substrate.

According to an aspect of the invention, the plurality of first barrier walls may be arranged to be spaced apart from each other in a first direction of the substrate, and each of the first barrier walls may be formed to flatly extend along a second direction perpendicular to the first direction, the plurality of second barrier walls may be arranged to be spaced apart from each other in the first direction of the substrate, and each of the second barrier walls may be formed to flatly extend along the second direction perpendicular to the first direction, and the first barrier walls and the second barrier walls may partition the space between the first nozzle unit and the second nozzle unit.

According to an aspect of the invention, a first barrier wall frame may be disposed to surround the plurality of the first barrier walls, and a second barrier wall frame may be disposed to surround the plurality of the second barrier walls.

According to an aspect of the invention, the second barrier walls may be respectively disposed to be parallel to and to be on the same plane as the first barrier walls in the second direction.

According to an aspect of the invention, the first slit units may be formed in the first nozzle unit to be arranged in a first direction of the substrate at equal intervals, and the second slit units may be formed in the second nozzle unit to be arranged in the first direction of the substrate at equal intervals.

According to an aspect of the invention, the number of the second slit units disposed between two adjacent first and second barrier walls may be greater than the number of the first slit units disposed between the two adjacent first and second barrier walls.

According to an aspect of the invention, the second nozzle unit and the substrate may be disposed to be separated from each other.

According to an aspect of the invention, the thin film deposition apparatus may be disposed in a vacuum chamber.

According to another aspect of the present invention, there is provided a thin film deposition apparatus for depositing a deposition material on a substrate, the thin film deposition apparatus including: a deposition source that is disposed opposite to a substrate and includes a deposition material that is vaporized; a first nozzle unit disposed in front of the deposition source and including a plurality of first slit units arranged in a first direction of the substrate; a second nozzle unit disposed between the first nozzle unit and the substrate and including a plurality of second slit units arranged in the first direction of the substrate; and a barrier wall assembly disposed between the first nozzle unit and the second nozzle unit and including a plurality of barrier walls arranged to partition the space between the first nozzle unit and the second nozzle unit, wherein the barrier wall assembly and the second nozzle unit are separated from each other by a first distance, and a first deposition blade is optionally disposed in the space between the barrier wall assembly and the second nozzle unit during a stand-by mode of the thin film deposition apparatus.

According to an aspect of the invention, the thickness of the first deposition blade may be less than the first distance between the barrier wall assembly and the second nozzle unit.

According to an aspect of the invention, the length of the first deposition blade may be the same as or greater than the length of the substrate.

According to an aspect of the invention, the plurality of barrier walls may be arranged to be spaced apart from each other in a first direction of the substrate, each of the barrier walls may be formed to flatly extend along a second direction perpendicular to the first direction, and the barrier walls may partition the space between the first nozzle unit and the second nozzle unit.

According to an aspect of the invention, a barrier wall frame may be disposed to surround the plurality of the barrier walls.

According to an aspect of the invention, the first slit units may be formed in the first nozzle unit to be arranged in a first direction of the substrate at equal intervals, and the second slit units may be formed in the second nozzle unit to be arranged in the first direction of the substrate at equal intervals.

According to an aspect of the invention, the number of the second slit units disposed between two adjacent barrier walls may be greater than the number of the first slit units disposed between the two adjacent barrier walls.

According to an aspect of the invention, the second nozzle unit and the substrate may be disposed to be separated from each other.

According to an aspect of the invention, the thin film deposition apparatus may be disposed in a vacuum chamber.

According to another aspect of the present invention, there is provided a thin film deposition apparatus including a deposition blade for depositing a deposition material on a substrate, the thin film deposition apparatus including: a substrate; a deposition source that is disposed opposite to the substrate and includes a deposition material that is vaporized; a first nozzle unit disposed between the substrate and the deposition source and including a plurality of first slit units arranged in a first direction of the substrate; a second nozzle unit disposed between the first nozzle unit and the substrate and including a plurality of second slit units arranged in the first direction of the substrate; and at least one barrier member assembly disposed between the first nozzle unit and the second nozzle unit and partitioning the space between the first nozzle unit and the second nozzle unit, wherein a deposition blade is optionally disposed in any space formed between the first nozzle unit and the barrier member assembly, between the barrier member assemblies, or between the barrier member assembly and the second nozzle unit when the thin film deposition apparatus is moved up and down during a stand-by mode.

According to an aspect of the invention, the thickness of the deposition blade may be less than the distance of the space.

According to an aspect of the invention, the length of the deposition blade may be the same as or greater than the length of the substrate.

According to an aspect of the invention, the barrier member assembly may include a plurality of barrier walls that partition the space between the first nozzle unit and the second nozzle unit.

According to an aspect of the invention, the plurality of barrier walls may be arranged to be spaced apart from each other in a first direction of the substrate, each of the barrier walls may be formed to flatly extend along a second direction perpendicular to the first direction.

According to an aspect of the invention, the barrier member assembly may include a first barrier wall assembly disposed in front of the first nozzle unit and including a plurality of first barrier walls and a second barrier wall assembly disposed between the first barrier wall assembly and the second nozzle unit and including a plurality of second barrier walls.

According to an aspect of the invention, the plurality of first barrier walls may be arranged to be spaced apart from each other in a first direction of the substrate, and each of the first barrier walls may be formed to flatly extend along a second direction perpendicular to the first direction, the plurality of second barrier walls may be arranged to be spaced apart from each other in the first direction of the substrate, and each of the second barrier walls may be formed to flatly extend along the second direction perpendicular to the first direction, and the first barrier walls and the second barrier walls may partition the space between the first nozzle unit and the second nozzle unit.

According to an aspect of the invention, the second barrier walls may be respectively disposed to be parallel to and to be on the same plane as the first barrier walls in the second direction.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
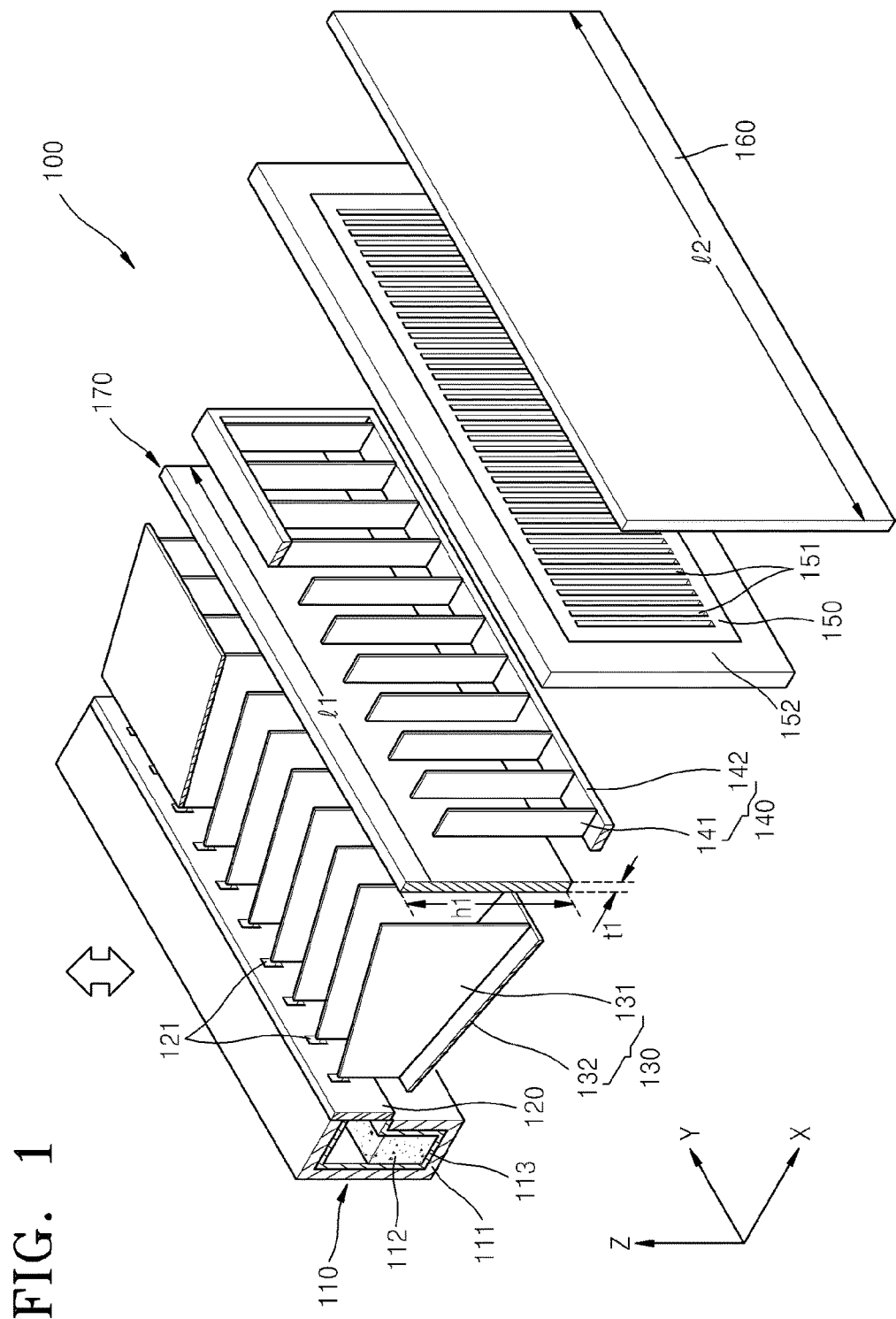
FIG. 1 is a schematic perspective view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
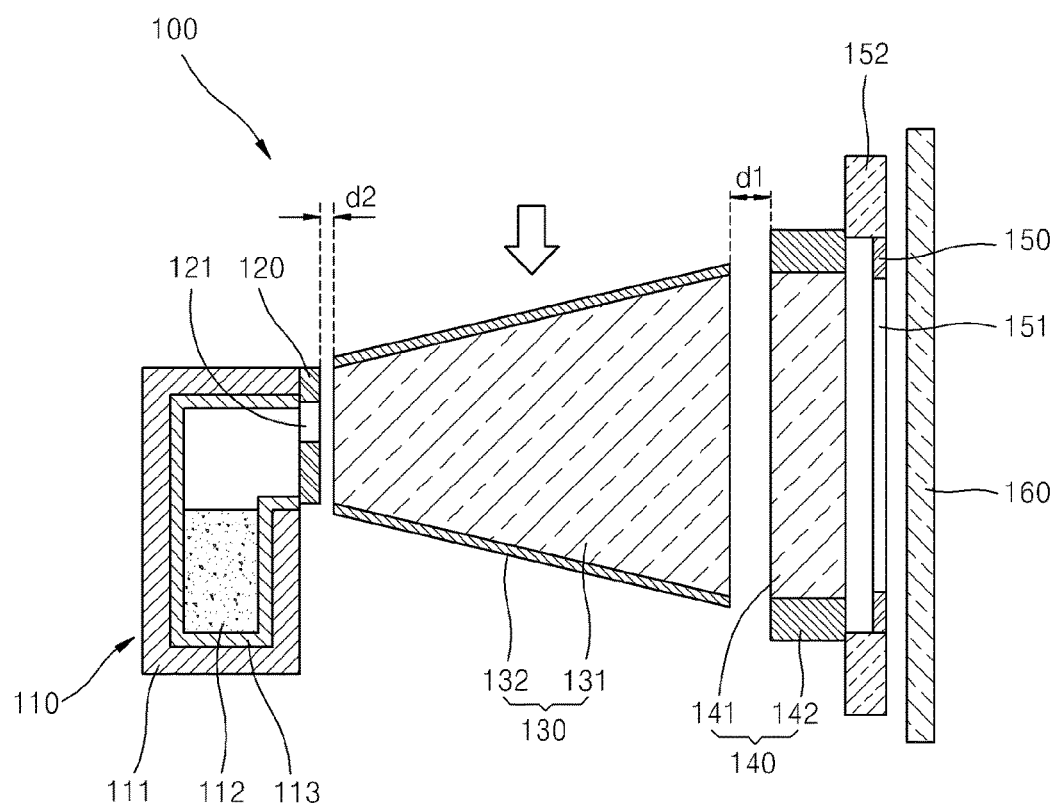
FIG. 2 is a schematic side view of the thin film deposition apparatus of FIG. 1 before a deposition blade is disposed.
Figure 3:
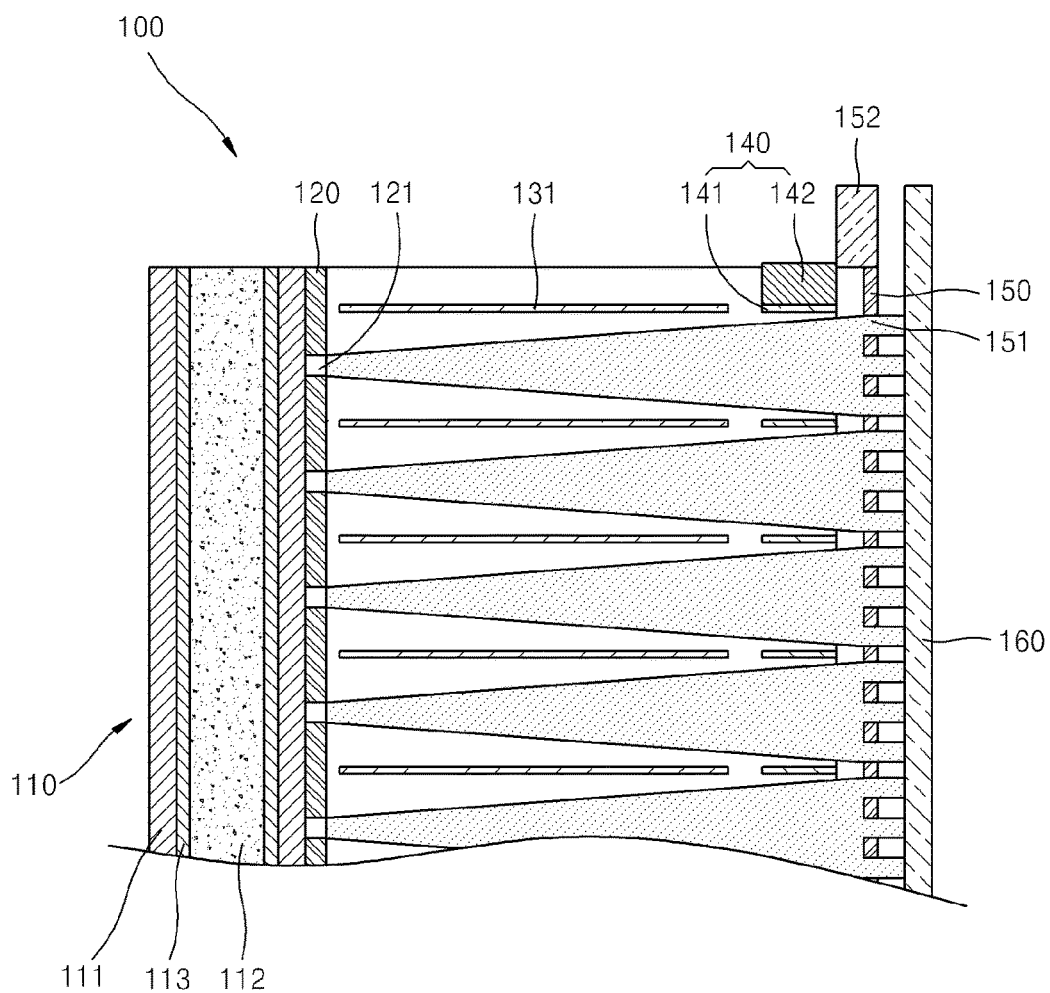
FIG. 3 is a schematic plan view of the thin film deposition apparatus of FIG. 1.

FIG. 1 is a schematic perspective view of a thin film deposition apparatus 100 according to an embodiment of the present invention, FIG. 2 is a schematic side view of the thin film deposition apparatus 100 of FIG. 1 before a deposition blade 170 is disposed, and FIG. 3 is a schematic plan view of the thin film deposition apparatus 100 of FIG. 1. Referring to FIGS. 1 to 3, the thin film deposition apparatus 100 includes a deposition source 110, a first nozzle unit 120, a first barrier wall assembly 130, a second barrier wall assembly 140, and a second nozzle unit 150. The first nozzle unit 120 is disposed in front of the deposition source 110. The first barrier wall assembly 130 is disposed in front of the first nozzle unit 120. The second barrier wall assembly 140 is disposed in front of the first barrier wall assembly 130. The second nozzle unit 150 is disposed in front of the second barrier wall assembly 140. The substrate 160 is disposed in front of the second nozzle unit 150. While shown with first and second barrier wall assemblies 130, 140 in the current example, it is understood that other numbers of barrier wall assemblies can be used, and that barrier wall assemblies are not required in all aspects of the invention.

The deposition source 110, the first nozzle unit 120, the first barrier wall assembly 130, the second barrier wall assembly 140, the second nozzle unit 150, and substrate 160 are disposed in a vacuum chamber 180 in order to allow a deposition material to move straight. In this regard, the temperature of the first barrier wall assembly 130, the second barrier wall assembly 140, and the second nozzle unit 150 is lower than that of the deposition source 110. For example, if the temperature of the first barrier wall assembly 130, the second barrier wall assembly 140, and the second nozzle unit 150 is less than about 100° C., the space between the first nozzle unit 120 and the second nozzle unit 150 may be maintained at a high vacuum.

If the temperature of the first barrier wall assembly 130, the second barrier wall assembly 140, and the second nozzle unit 150 is sufficiently low, the deposition material 112 that has collided against the first barrier wall assembly 130 and the second barrier wall assembly 140 may not be vaporized again, and thereby maintaining the chamber at a high vacuum. Thus, since the deposition materials 112 do not collide with each other, the deposition materials 112 may move straight.

The deposition source 110 includes a heat resistant unit such as a crucible 111. The crucible 111 is filled with the deposition material 112 to be deposited on the substrate 160. A heater 113 is disposed on the inner surface of the crucible 111 and vaporizes the deposition material 112 in the crucible 111.

The first nozzle unit 120 is disposed in front of the deposition source 110. The first nozzle unit 120 includes a plurality of first slit units 121 arranged at equal intervals. The first slit units 121 are arranged in the Y-axis direction of the substrate 160. The deposition material 112 that is vaporized in the deposition source 110 proceeds toward the substrate 160 via the first slit units 121.

The first barrier wall assembly 130 is disposed in front of the first nozzle 120. The first barrier wall assembly 130 includes a plurality of first barrier walls 131. The first barrier walls 131 are arranged parallel to each other at equal intervals in the Y-axis direction of the substrate 160. Each of the first barrier walls 131 are shown formed to extend along an XZ plane (i.e., perpendicular to the Y-axis direction). However, the invention is not limited to the shown orientation.

The first barrier walls 131 are respectively disposed between adjacent pairs of the first slit units 121. In other words, one first slit unit 121 is disposed between each two adjacent first barrier walls 131. Each first slit unit 121 is disposed at a midpoint between the two adjacent first barrier walls 131. However, it is understood that other numbers of first slit units 121 can be disposed between adjacent pairs of the first barrier walls 131, and that the first slit unit 121 does not have to be at the midpoint between the two adjacent first barrier walls 131 in all aspects of the invention.

A first barrier wall frame 132 is disposed to surround the plurality of first barrier walls 131. The first barrier wall frame 132 covers upper and lower sides of the first barrier walls 131 and retains the positions of the first barrier walls 131.

The second barrier wall assembly 140 is disposed in front of the first barrier wall assembly 130. The second barrier wall assembly 140 includes a plurality of second barrier walls 141. The second barrier walls 141 are arranged parallel to each other at equal intervals in the Y-axis direction of the substrate 160. Each of the second barrier walls 141 are shown formed to extend along an XZ plane (i.e., perpendicular to the Y-axis direction), but the invention is not limited to the shown orientation.

The second barrier walls 141 should be accurately aligned with second slit units 151 of the second nozzle unit 150, respectively. Thus, each of the second barrier walls 141 may be formed to be relatively thinner than each of the first barrier walls 131. In contrast, the first barrier walls 131 do not need to be precisely aligned with the second slit units 151 of the second nozzle unit 150. Therefore, the first barrier walls 131 may be formed to be relatively thick. This makes it easier to manufacture the first barrier walls 131.

A second barrier wall frame 142 is disposed to surround the plurality of second barrier walls 141. The second barrier wall frame 142 retains the positions of the second barrier walls 141. In this regard, the second barrier walls 141 are aligned to correspond to the first barrier walls 131, respectively. The second barrier walls 141 may be respectively disposed to be parallel to and coplanar with the first barrier walls 131 in the X-axis direction of the substrate 160 to partition the space between the first nozzle unit 120 and the second nozzle unit 150. Accordingly, the deposition material 112 discharged through one first slit unit 121 is not mixed with the deposition material 112 discharged through another first slit unit 121, and is deposited on the substrate 160 through the second slit units 151 of the second nozzle unit 150. However, it is understood that the invention is not limited to the shown orientation in all aspects and that the second barrier walls 141 need not be precisely parallel to and coplanar with the first barrier walls 131 in the X-axis in all aspects of the invention.

The first barrier wall assembly 130 and the second barrier wall assembly 140 are disposed to be separated from each other by a predetermined distance. The first barrier wall assembly 130 may be separated from the second barrier wall assembly 140 since it is unnecessary to precisely align the first barrier walls 131 and the second barrier walls 141. The second barrier walls 141 should be precisely aligned with the second nozzle unit 150. Thus, high-precision control may be easily achieved by separating a part required to be precisely controlled from a part not required to be precisely controlled.

In addition, the temperature of the first barrier wall assembly 130 may increase to 100° C. or higher due to the high temperature of the deposition source 110. In order to prevent the heat of the first barrier wall assembly 130 from being conducted to the second barrier wall assembly 140 and the second nozzle unit 150, the first barrier wall assembly 130 and the second barrier wall assembly 140 are separated from each other.

Furthermore, the deposition material 112 adhered to the first barrier wall assembly 130 may be reused, whereas the deposition material 112 adhered to the second barrier wall assembly 140 and the second nozzle unit 150 may not be reused in all aspects of the invention. Thus, when the first barrier wall assembly 130 is separated from the second barrier wall assembly 140 and the second nozzle unit 150, it may be straightforward to recover the deposition material 112 to be reused. However, it is understood that the deposition material 112 adhered to the second barrier wall assembly 140 can be reused in other aspects.

The second nozzle unit 150 is disposed between the second barrier wall assembly 140 and the substrate 160. The second nozzle unit 150 includes a plurality of second slit units 151 arranged at equal intervals. The second slit units 151 are arranged in the Y axis direction of the substrate 160. A second nozzle unit frame 152 is formed to surround the second nozzle unit 150.

In this regard, a total number of the second slit units 151 is greater than a total number of the first slit units 121. In addition, the number of the second slit units 151 disposed between two adjacent first and second barrier walls 131 and 141 may be greater than the number of the first slit units 121 disposed between the two adjacent first and second barrier walls 131 and 141. Although one first slit unit 121 corresponds to three second slit units 151 in FIGS. 1 to 3, the number of the second slit units 151 corresponding to one first slit unit 121 may vary according to requirements for the resultant products.

The second nozzle unit 150 and the substrate 160 are disposed to be separated from each other by a predetermined distance. Accordingly, a defect caused by the contact between the second nozzle unit 150 and the substrate 160 may be prevented. In addition, deposition is performed while the thin film deposition apparatus 100 is moved relative to the substrate 160 in the Z-axis direction. Thus, the length of the second nozzle unit 150 in the Z-axis direction may be less than the length of the substrate 160 in the Z-axis direction.

Meanwhile, the substrate 160 may be a substrate for flat panel displays. A large substrate, such as a mother glass, for manufacturing a plurality of flat panel displays, may be used as the substrate 160.

In this regard, once the operation of the thin film deposition apparatus 100 is started, the temperature of the thin film deposition apparatus 100 should be constantly maintained without turning off the deposition source 110 until the deposition material 112 is exhausted in order to prevent denaturation of the deposition material 112 (e.g., an organic material). Accordingly, even during a stand-by mode, the deposition material 112 is continuously discharged to a vacuum chamber through the second nozzle unit 150 to be deposited on the second nozzle unit 150. Therefore, this deposition through the second nozzle unit 150 during the stand-by mode should be prevented.

An example of the stand-by mode includes a time period between one deposition process for the substrate 160 and a subsequent deposition process for another substrate 160. However, the stand-by mode can be any interruption in the deposition process during which the deposition material 112 is being vaporized but the deposition material 112 should not pass through the second nozzle unit 150, such as where the second nozzle unit 150 is being exchanged for another mask.

In order to prevent the deposition of the deposition material 112 during the stand-by period, a deposition blade 170 is optionally disposed at the space (d1) between the first barrier wall assembly 130 and the second barrier wall assembly 140. If the deposition blade 170 is disposed between the first barrier wall assembly 130 and the second barrier wall assembly 140, the deposition material 112 discharged from the deposition source 110 may not be adhered to undesirable regions, such as the second nozzle unit 150. Instead, the deposition material 112 is deposited on the deposition blade 170.

The shown deposition blade 170 is a flat panel. The length (l1) of the deposition blade 170 is the same as or greater than the length (l2) of the substrate 160 to be patterned. Thus, contamination of the substrate 160 may be prevented. The height (h1) of the deposition blade 170 may be enough to cover the first barrier wall assembly 130. The thickness (t1) of the deposition blade 170 may be less than the distance between the first barrier wall assembly 130 and the second barrier wall assembly 140, and may vary according to requirements for products.

While shown as a flat panel, it is understood that the deposition blade 170 can be formed of multiple elements, and need not be of the same material in all aspects of the invention. Further, while shown as having the length (l1) that is the same as or greater than the length (l2) of the substrate 160 to be patterned, the deposition blade 170 length (l1) need only be long enough to prevent the deposition material 112 from passing to the second nozzle unit 150, and therefore need only have a blocking surface having a length of the second nozzle unit 150 or the second barrier wall assembly 140 depending on the space in which the deposition blade 170 is inserted. While not required in all aspects, the deposition blade 170 can be of the same material as the first and second barrier wall assemblies 130, 140. Further, while one deposition blade 170 is shown, it is understood that multiple deposition blades can be used in disposed in different spaces between the first and second nozzle units 120, 150.

Even though the deposition blade 170 is optionally disposed between the first barrier wall assembly 130 and the second barrier wall assembly 140 herein, the present invention is not limited thereto. The deposition blade 170 may also be disposed in any space formed between units 120, 150 in the thin film deposition apparatus 100.

For example, a space (d2) may be formed between the deposition source 110 and the first barrier wall assembly 130. The deposition blade 170 may further be disposed in the space (d2). However, if the deposition blade 170 is disposed in the space (d2), the temperature conducted from the deposition source 110 should be considered. Meanwhile, the deposition blade 170 may also be formed between the second barrier wall assembly 140 and the second nozzle unit 150.

A deposition process of the thin film deposition apparatus 100 having the structure described above will be described. As shown in FIGS. 2 and 3, the deposition material 112 vaporized in the deposition source 110 passes through the first slit units 121 of the first nozzle unit 120, the space partitioned by the first barrier walls 131 and the second barrier walls 141, and the second slit units 151 of the second nozzle unit 150 to be deposited on the substrate 160. In a deposition mode as described above, the deposition blade 170 is not disposed in the space (d1) between the first barrier wall assembly 130 and the second barrier wall assembly 140.

Since the space between the first nozzle unit 120 and the second nozzle unit 150 is partitioned by the first barrier walls 131 and the second barrier walls 141, the deposition material 112 discharged through one first slit unit 121 of the first nozzle unit 120 is not mixed with the deposition material 112 discharged through another adjacent first slit unit 121 due to the first barrier walls 131 and the second barrier walls 141. When the space between the first nozzle unit 120 and the second nozzle unit 150 is partitioned by the first barrier walls 131 and the second barrier walls 141, the deposition material 112 is deposited on the substrate 160 through the second nozzle unit 150 at an angle that is substantially perpendicular to the substrate 160.

When deposition on one substrate 160 is completed, the thin film deposition apparatus 100 is moved up and down to enter a stand-by mode. However, the deposition material 112 is continuously vaporized by the deposition source 110 during the stand-by mode. Thus, unless the deposition blade 170 is used, the deposition material 112 is deposited on the second nozzle unit 150. Since the width of the pattern of the second nozzle unit 150 is reduced due to the continuous vaporization of the deposition material 112, the exchange cycle of the second nozzle unit 150 is reduced.

Figure 4:
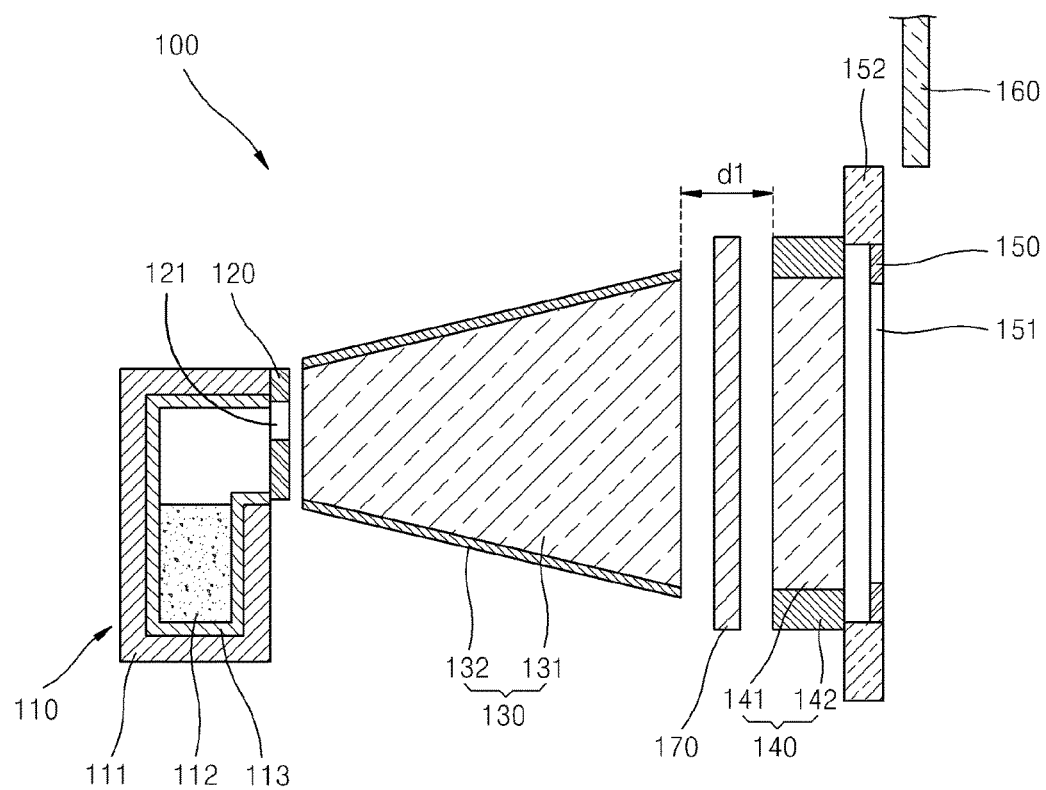
FIG. 4 is a schematic side view of the thin film deposition apparatus of FIG. 1 after a deposition blade is disposed.

In order to prevent this, as shown in FIG. 4, when the thin film deposition apparatus 100 is moved up and down to enter the stand-by mode, the deposition blade 170 is disposed in the space (d1) between the first barrier wall assembly 130 and the second barrier wall assembly 140.

Since the deposition blade 170 is disposed in the space (d1), the deposition material 112 is adhered to the surface of the deposition blade 170 even while the deposition material 112 is continuously discharged from the deposition source 110 that is heated. Thus, the deposition of the deposition material 112 on the second nozzle unit 150 may be prevented.

Figure 5:
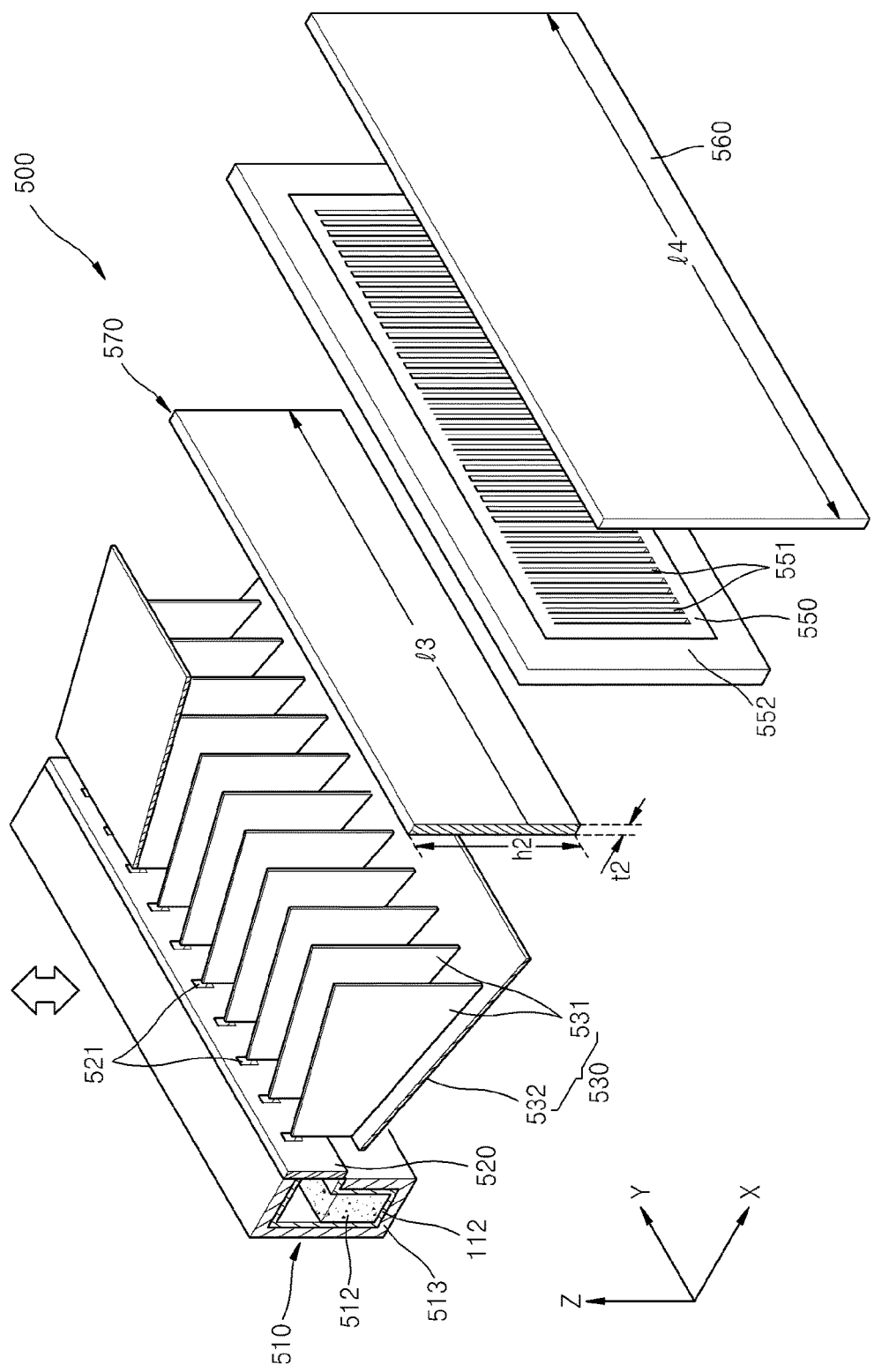
FIG. 5 is a schematic perspective view of a thin film deposition apparatus according to another embodiment of the present invention.

FIG. 5 is a schematic perspective view of a thin film deposition apparatus 500 according to another embodiment of the present invention. Referring to FIG. 5, the thin film deposition apparatus 500 includes a deposition source 510, a first nozzle unit 520, a barrier wall assembly 530, and a second nozzle unit 550. The first nozzle unit 550 is disposed in front of the deposition source 510. A barrier wall assembly 530 is disposed in front of the first nozzle unit 520. A second nozzle unit 550 is disposed in front of the barrier wall assembly 530. A substrate 560 is disposed in front of the second nozzle unit 550. According to the current embodiment, there is not second barrier wall assembly used.

The deposition source 510 includes a crucible 511 and a heater 513. The crucible 511 holds the deposition material 512. The heater 513 heats the crucible 511 to vaporize the deposition material 512 contained in the crucible 511 toward the first nozzle unit 520.

The first nozzle unit 520 is disposed in front of the deposition source 510. The first nozzle unit 520 includes a plurality of first slit units 521 arranged at equal intervals in the Y-axis direction of the substrate 560. The deposition material 512 proceeds toward the substrate 560 via the first slit units 521.

The barrier wall assembly 530 is disposed in front of the first nozzle unit 520. The barrier wall assembly 530 includes a plurality of barrier walls 531, and a barrier wall frame 532 that surrounds sides of the barrier walls 531. One first slit unit 521 is disposed between each two adjacent barrier walls 531. The first slit unit 521 is disposed at the center between each two adjacent barrier walls 531. However, it is understood that other numbers of first slit units 521 can be disposed between adjacent pairs of the first barrier walls 531, and that the first slit unit 521 does not have to be at the midpoint between the two adjacent first barrier walls 531 in all aspects of the invention.

The second nozzle unit 550 is disposed between the barrier wall assembly 530 and the substrate 560. The second nozzle unit 550 includes a plurality of second slit units 551 arranged at equal intervals. A second nozzle unit frame 552 is formed to surround the second nozzle unit 550.

A total number of the second slit units 551 is greater than a total number of the first slit units 521. The number of the second slit units 551 disposed between two adjacent barrier walls 531 is greater than the number of the first slit unit 521 disposed between the same two adjacent barrier walls 531. The second nozzle unit 550 and the substrate 560 are disposed to be separated from each other by a predetermined distance.

The barrier wall assembly 530 and the second nozzle 550 are separated from each other by a predetermined distance (d3). In order to prevent the deposition of the deposition material 512 on the second nozzle unit 550 during the stand-by mode, the deposition blade 570 is removably disposed in the space (d3). The deposition material 512 discharged from the deposition source 510 does adhere not to undesirable regions, such as the second nozzle unit 550, due to the deposition blade 570.

The length (l3) of the deposition blade 570 is the same as or greater than the length (l4) of the substrate 560. The height (h2) of the deposition blade 570 may be enough to cover the barrier wall assembly 530. The thickness (t2) of the deposition blade 570 may be less than the distance (d3) between the barrier wall assembly 530 and the second nozzle unit 550.

Even though the deposition blade 570 is optionally disposed between the barrier wall assembly 530 and the second nozzle unit 550 herein, the present invention is not limited thereto. The deposition blade 570 may also be disposed in any space formed between units 520, 550 in the thin film deposition apparatus 500. Further, while shown as having the length (l3) that is the same as or greater than the length (l4) of the substrate 560 to be patterned, the deposition blade 570 length (l3) need only be long enough to prevent the deposition material 512 from passing to the second nozzle unit 550, and therefore need only have a blocking surface having a length of the second nozzle unit 550 or the first barrier wall assembly 540 depending on the space in which the deposition blade 570 is inserted. While not required in all aspects, the deposition blade 570 can be of the same material as the first barrier wall assemblies 530.

In the thin film deposition apparatus 500 having the structure as described above, the deposition material 512 vaporized in the deposition source 510 passes through the first slit units 521 of the first nozzle unit 520, the space partitioned by the barrier walls 530, and the second slit units 551 of the second nozzle unit 550 to be deposited on the substrate 560. In this regard, the deposition blade 570 is not disposed in the space (d3) between the barrier wall assembly 530 and the second nozzle unit 550 during deposition.

Figure 6:
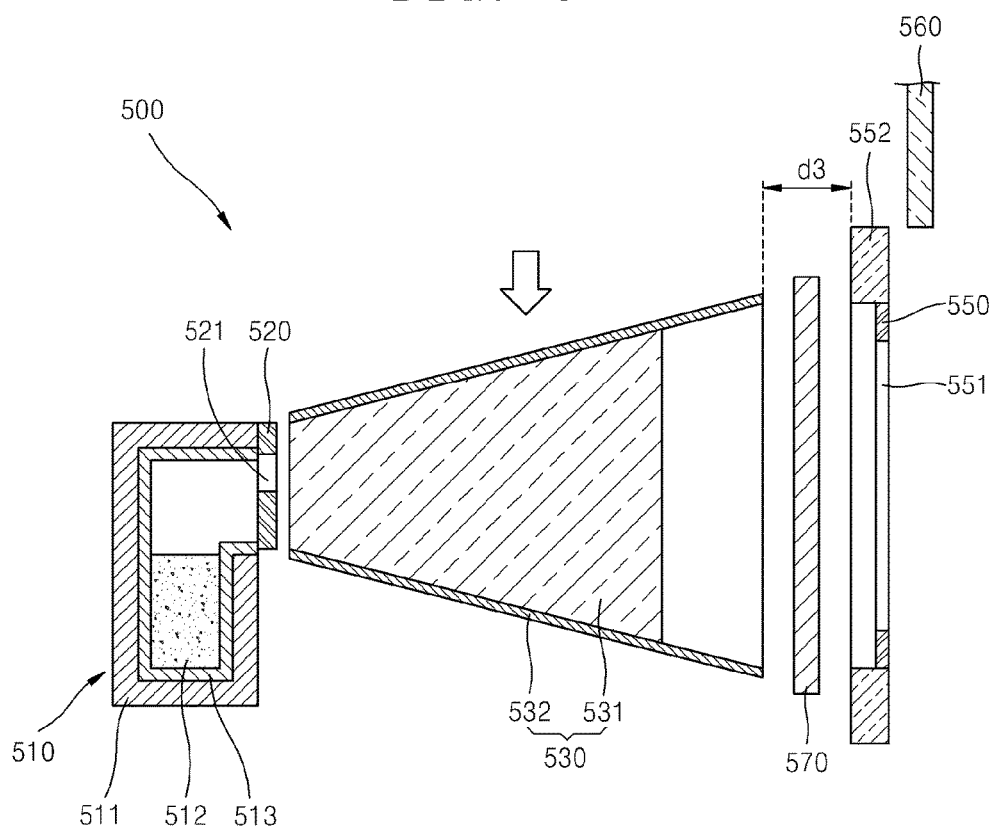
FIG. 6 is a schematic side view of the thin film deposition apparatus of FIG. 5 after a deposition blade is disposed.

When deposition on one substrate 560 is completed, the thin film deposition apparatus 500 is moved up and down to enter a stand-by mode. However, the deposition material 512 is continuously vaporized by the deposition source 510 during the stand-by mode. As such, as shown in FIG. 6, when the thin film deposition apparatus 500 is moved up and down to enter the stand-by mode, the deposition blade 570 is optionally disposed in the space (d3) between the barrier wall assembly 530 and the second nozzle unit 550.

Since the deposition blade 570 is disposed in the space (d3), the deposition material 512 is adhered to the surface of the deposition blade 570 even while the deposition material 512 is continuously discharged from the deposition source 512. Thus, the deposition of the deposition material 512 on the second nozzle unit 550 may be prevented.

As described above, deposition of the deposition material continuously discharged from the deposition source on undesirable regions in the chamber such as the nozzle unit may be prevented during the stand-by mode using the thin film deposition apparatus including the deposition blade since the deposition blade may be optionally disposed in any space formed between two units selected from the group consisting of the first barrier wall assembly, the second barrier wall assembly, and the nozzle unit.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of performing deposition on a substrate, the method comprising:
    completing a deposition process on the substrate by depositing a deposition material from a deposition source which holds the deposition material, after passing the deposition material through a first nozzle unit comprising a plurality of first slit units arranged in a first axis direction of the substrate, and a second nozzle unit comprising a plurality of second slit units arranged in the first axis direction, wherein the deposition source and the first and second nozzle units are configured to move relative to the substrate in a second axis direction perpendicular to the first axis direction during the deposition process, and wherein the second nozzle unit defines a pattern of the deposition material on the substrate;
    entering a stand-by mode between the deposition process and another deposition process;
    inserting a deposition blade into a space between the first and second nozzle units by moving the deposition source and the first and second nozzle units along the second axis direction, to block the deposition material passing through the first nozzle from passing through the second nozzle unit during the stand-by mode; and
    removing the deposition blade from the space by moving the first and second nozzle units along the second axis direction, to allow the deposition material to pass through the second nozzle unit during the another deposition process.

2. The method of claim 1, wherein:
    the completing the deposition process further comprises guiding the deposition material between the first nozzle unit and the second nozzle unit using a barrier wall assembly which partitions the space, and
    the inserting the deposition blade comprises inserting the deposition blade in a gap between the barrier wall assembly and one of the first and second nozzle units.

3. The method of claim 1, wherein:
    the completing the deposition process further comprises guiding the deposition material between the first nozzle unit and the second nozzle unit using first barrier wall assembly comprising a plurality of first barrier walls and a second barrier wall assembly disposed between the first barrier wall assembly and the second nozzle unit and comprising a plurality of second barrier walls, the first and second barrier walls being arranged to partition the space between the first nozzle unit and the second nozzle unit, and
    the inserting the deposition blade comprises inserting the deposition blade in a gap between the first and second barrier wall assemblies.

4. The method of claim 1, further comprising removing the substrate used in the deposition process and inserting another substrate to be used in the another deposition process after inserting the deposition blade and prior to removing the deposition blade.

* * * * *